United States Patent
Kim

(10) Patent No.: US 9,997,549 B2
(45) Date of Patent: Jun. 12, 2018

(54) IMAGE SENSOR WITH SOLAR CELL FUNCTION AND ELECTRONIC DEVICE THEREOF

(71) Applicant: Hoon Kim, Singapore (SG)

(72) Inventor: Hoon Kim, Singapore (SG)

(73) Assignee: Hoon Kim (KR)

( * ) Notice: Subject to any disclaimer, the term of this patent is extended or adjusted under 35 U.S.C. 154(b) by 0 days. days.

(21) Appl. No.: 15/644,731

(22) Filed: Jul. 7, 2017

(65) Prior Publication Data

US 2017/0309656 A1    Oct. 26, 2017

Related U.S. Application Data

(62) Division of application No. 14/883,589, filed on Oct. 14, 2015, now Pat. No. 9,735,189.

(60) Provisional application No. 62/104,068, filed on Jan. 15, 2015.

(51) Int. Cl.
| | |
|---|---|
| *H01L 31/062* | (2012.01) |
| *H01L 31/113* | (2006.01) |
| *H01L 27/142* | (2014.01) |
| *H01L 27/146* | (2006.01) |
| *H01L 31/053* | (2014.01) |

(52) U.S. Cl.
CPC ........ *H01L 27/142* (2013.01); *H01L 27/1461* (2013.01); *H01L 27/14612* (2013.01); *H01L 27/14643* (2013.01); *H01L 31/053* (2014.12)

(58) Field of Classification Search
CPC .............. H01L 27/142; H01L 27/1461; H01L 27/14643; H01L 31/053; H01L 27/14612
See application file for complete search history.

(56) References Cited

U.S. PATENT DOCUMENTS

| | | | |
|---|---|---|---|
| 4,173,765 | A | 11/1979 | Heald et al. |
| 4,623,909 | A | 11/1986 | Nishizawa et al. |
| 4,906,856 | A | 3/1990 | Iwanami et al. |
| 5,017,991 | A | 5/1991 | Nishizawa et al. |
| 5,274,459 | A | 12/1993 | Hamasaki |

(Continued)

FOREIGN PATENT DOCUMENTS

| | | |
|---|---|---|
| EP | 0067566 A2 | 12/1982 |
| JP | 5850030 B2 | 11/1983 |

(Continued)

OTHER PUBLICATIONS

European Search Report for 12827107.9, dated Jun. 17, 2015.

(Continued)

*Primary Examiner* — Victor A Mandala
(74) *Attorney, Agent, or Firm* — Renaissance IP Law Group LLP

(57) ABSTRACT

A unit pixel element that acts as an image sensor or a solar cell according to the present invention comprises a photo detector that drives a photocurrent flow, induced by light incident onto the gate, along the channel between the source and the drain; a first switch that is wired and switched on or switched off between the source terminal of the photo detector and the first solar cell bus; and a second switch that is wired and switched on or switched off between the gate terminal of the photo detector and the second solar cell bus, and features a function of light energy harvesting and high-efficiency photoelectric conversion that generates and supplies effective electric power.

7 Claims, 10 Drawing Sheets

(56) References Cited

U.S. PATENT DOCUMENTS

| | | | |
|---|---|---|---|
| 5,880,494 A | 3/1999 | Watanabe | |
| 5,886,368 A | 3/1999 | Forbes et al. | |
| 6,150,693 A | 11/2000 | Wollesen | |
| 6,303,919 B1 | 10/2001 | Yokomichi et al. | |
| 6,864,920 B1* | 3/2005 | Kindt | H04N 3/155 348/308 |
| 7,196,312 B2 | 3/2007 | Shizukuishi | |
| 7,271,430 B2 | 9/2007 | Park et al. | |
| 7,466,255 B1* | 12/2008 | Ignjatovic | H01L 27/14609 341/143 |
| 8,569,806 B2 | 10/2013 | Kim | |
| 8,610,234 B2 | 12/2013 | Kim | |
| 8,653,618 B2 | 2/2014 | Kim | |
| 8,669,598 B2 | 3/2014 | Kim | |
| 8,669,599 B2 | 3/2014 | Kim | |
| 9,366,570 B1* | 6/2016 | Wiser | G01J 1/46 |
| 2004/0217262 A1 | 11/2004 | Lee | |
| 2005/0082582 A1 | 4/2005 | Rhodes | |
| 2005/0151061 A1 | 7/2005 | Ogura et al. | |
| 2008/0211047 A1 | 9/2008 | Iida | |
| 2008/0237664 A1 | 10/2008 | Joo et al. | |
| 2009/0032852 A1 | 2/2009 | Song et al. | |
| 2009/0101915 A1 | 4/2009 | Weng et al. | |
| 2009/0256176 A1 | 10/2009 | Kobayashi et al. | |
| 2009/0302358 A1 | 12/2009 | Mao et al. | |
| 2010/0073538 A1 | 3/2010 | Cieslinski | |
| 2010/0270459 A1 | 10/2010 | Augusto | |
| 2010/0295602 A1* | 11/2010 | Hoshino | H03K 17/6874 327/436 |
| 2011/0042551 A1 | 2/2011 | Ha | |
| 2011/0073150 A1* | 3/2011 | Hightower | G05F 1/67 136/244 |
| 2013/0049084 A1 | 2/2013 | Saka | |
| 2013/0134298 A1* | 5/2013 | Maltere | G01J 1/18 250/214.1 |
| 2015/0281621 A1* | 10/2015 | Ni | H04N 5/3592 250/208.1 |
| 2015/0372047 A1* | 12/2015 | Ni | H01L 27/14649 257/443 |
| 2017/0359537 A1* | 12/2017 | Sakano | H04N 5/3594 |

FOREIGN PATENT DOCUMENTS

| | | |
|---|---|---|
| JP | 61228668 A | 10/1986 |
| JP | 7255013 A | 10/1995 |
| JP | 8180174 A | 7/1996 |
| JP | 10242443 A | 9/1998 |
| JP | H11312798 A | 11/1999 |
| JP | 2001177702 A | 6/2001 |
| JP | 2001230443 A | 8/2001 |
| JP | 2008294590 A | 12/2008 |
| JP | 2011243704 A | 12/2011 |
| JP | 2014529906 A | 11/2014 |
| JP | 2007281144 A | 10/2017 |
| KR | 20050054059 | 6/2005 |
| KR | 100558527 B1 | 3/2006 |
| KR | 20090043737 | 5/2009 |
| WO | 9812741 A | 3/1998 |
| WO | 2009136285 A2 | 11/2009 |

OTHER PUBLICATIONS

European Search Report for 12828199.5, dated Jun. 2, 2015.
Notice of Allowance for U.S. Appl. No. 14/883,587, dated Apr. 11, 2017.
Notice of Allowance for U.S. Appl. No. 14/883,589, dated Apr. 11, 2017.

* cited by examiner

IMAGE SENSOR WITH SOLAR CELL FUNCTION AND ELECTRONIC DEVICE THEREOF

CROSS-REFERENCE TO RELATED APPLICATIONS

This application is a divisional of U.S. patent application Ser. No. 14/883,589, filed Oct. 14, 2015, which claims the benefit of U.S. Provisional Application No. 62/104,068, filed Jan. 15, 2015.

TECHNICAL FIELD

The present invention relates to an image sensor that also acts as a solar cell and an electronic device using the image sensor with a solar cell function and, more specifically, to a technology that acts, in general, as an image sensor and operates, as necessary, by being converted to a specific mode, as a solar cell.

BACKGROUND ART

Light energy harvesting, which wirelessly charges an existing battery by converting light energy to electric power, is a technology inevitably required to establish the Internet of things (IoT), ubiquitous sensor networks (USN), wireless sensor networks (WSN) and the like and acts as a semi-permanent power source supplied to diverse electronic devices related to such fields.

Accordingly, the light energy harvesting technology is required to be microminiaturized and integrated. Although some studies have shown attempts to manufacture a light energy conversion device that is similar to an integrated solar cell (ISC) by employing P-N junction photodiode technique from the CMOS process in order to integrate the light energy conversion device into another circuit, such a photodiode exhibits a low photoelectric conversion efficiency, which is not adequate to supply the circuits in the chip with sufficient power. Furthermore, it is a long way to go to fully integrate a solar cell process with a standard CMOS process.

The present invention relates to a method and technical thoughts pertinent to it to provide a pixelated solar cell system on chip (SOC) on the basis of and improving the registered patents, "Unit Pixel of Image Sensor and Photo Detector Thereof" (U.S. Pat. Nos. 8,569,806B2, 8,610,234B2 and 8,669,599B2). To this purpose, the structure and operation of a photo detector and a pixelated solar cell manufactured via a standard CMOS process will be described and a method will be proposed where a pixel of a solar cell thus manufactured shares a single cell with a pixel of an image sensor so that each function may be selected as necessary.

DISCLOSURE

Technical Problem

Accordingly, in order to solve those problems aforementioned, the present invention provides a method to make a pixel of a solar cell equipped with a high-efficiency photo detector share a single cell with a pixel of an image sensor and to select, as necessary, either of the both functions to use as an image sensor or as a solar cell to produce and store driving power.

Technical Solution

An array element that may act as an image sensor or a solar cell according to an embodiment of the present invention comprises subelements each of which arrays two or more unit pixel elements in a first direction; and a subelement switch that is switched on or switched off between the subelements in order to array two or more subelements in a second direction, wherein the subelement comprises a photo detector that drives a photocurrent flow, induced by light incident onto the gate, along the channel between the source and the drain; and a unit pixel element that includes a first switch and a second switch that connects the terminals of the photo detector to the first solar cell bus and the second solar cell bus.

An array element that may act as an image sensor or a solar cell according to yet another embodiment of the present invention comprises subelements that array two or more unit pixel elements in a first direction; and a subelement switch that is switched on or switched off between the subelements in order to array two or more the subelements in a second direction, wherein the subelement comprises a photo detector that drives a photocurrent flow, induced by light incident onto the gate, along the channel between the source and the drain; and An electronic device equipped with a technology that may act as an image sensor or a solar cell according to an embodiment of the present invention comprises an image sensor section that comprises two or more unit pixels that may act as a solar cell depending on a control signal; and a processor that generates the control signal and transmits the control signal to the image sensor section, wherein each of the unit pixels includes a photo detector that drives a photocurrent flow, induced by light incident onto the gate, along the channel between the source and the drain.

Advantageous Effects

A technology according to an embodiment of the present invention may provides a technology that may act as an image sensor equipped with a function of light energy harvesting and effectively produce and supply power.

In addition, a technology according to a preferred embodiment of the present invention may be manufactured being fully integrated with ease to adjacent circuits including an image sensor and all the circuits as well manufactured in a CMOS process.

MODE FOR INVENTION

Since the present invention may have a plurality of variations and embodiments, a few specific embodiments will now be exemplified in details with reference to drawings and descriptions. The structural and functional statements provided for an embodiment, however, are nothing more than an exemplification of the purpose of the embodiment, and must not be interpreted to restrict the present invention within a specific mode for carrying out the invention but must be interpreted to include all the modifications, equivalents and substitutes that are incorporated in the scope of the thoughts and technology of the present invention.

Any detailed description on related, well-known technology will be omitted should the detailed description be judged to obscure the intent of the present invention. Those numerals, such as the first, the second, etc., referred to in this specification are nothing more than an identifier to distinguish a certain element from another.

Should an element of the present invention be described to be "wired", "connected", "linked", etc., to other element(s), it must be interpreted that the element may be explicitly and directly wired, connected, linked, etc. to another element(s) or, except otherwise contrarily provided, it must be also interpreted that the element may be wired, connected, linked, etc. to other element(s) with other component(s) in between.

Preferred embodiments of the present invention will now be described more specifically with reference to the accompanying drawings.

Figure 1:
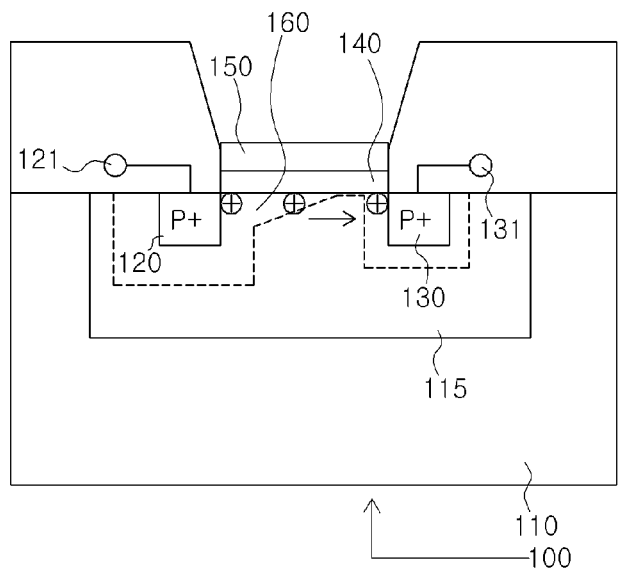
FIG. 1 is a cross-sectional view of a photo detector that shows high-efficiency photoelectric conversion according to the present invention.

FIG. 1 is a cross-sectional view of a photo detector that shows high-efficiency photoelectric conversion according to the present invention.

A light-receiving device, which corresponds to the photo detector, of a unit pixel is established by means of a tunnel junction device instead of an existing photodiode as illustrated in FIG. 1, where a tunnel junction device, in which a thin insulating layer is sandwiched between two conductors or semiconductors, is defined as an electronic element that operates using a tunneling effect generated in the insulating layer. For information purpose, a tunneling effect, as a term based on quantum mechanics, is a phenomenon that a particle that moves where force having potential exerts its effect penetrates an area the potential energy of which is larger than the kinetic energy the particle has.

An embodiment of the present invention provides a method to produce a light-receiving device and a solar cell as a unit pixel by means of such a photo detector, where the term "photo detector" used in the specifications and claims refers to a light-receiving device and a solar cell materialized by means of the tunnel junction device. The photo detector may be established into various configurations including, for example, a common n-MOSFET or p-MOSFET. In addition, the unit device may also be established using a JFET, a HEMT, etc. that derives a tunneling effect.

As illustrated in FIG. 1, the photo detector 100 has a PMOS structure. The photo detector 100 is built up on a p-substrate 110, designated also as P-sub in FIG. 1, and comprising a P+ diffusion layer 120 and another P+ diffusion layer 130 that corresponds to the source and drain, respectively, of a common NMOS. Each P+ diffusion layer 120, 130 will be referred to as the "source" and "drain", respectively, of a photo detector according to the present invention.

On top of the source 120 and drain 130 are built up a source electrode 121 and drain electrode 131 that is wired to an external node, respectively.

An N-well 115 is structured upon n-type impurities being doped onto the P-sub 110 for the photo detector 110. On the N-well thus formed are constructed the source 120 and the drain 130, doped by P-type impurities. Then, a thin oxide layer 140 is formed between the source 120 and the drain and a polysilicon area, doped by n-type impurities, is formed that corresponds to the gate of a common MOSFET on the top of the oxide layer 140. The polysilicon 150 area acts as a light-receiving component in the photo detector, therefore the polysilicon 150 is to be referred to as "light-receiving section" hereinafter.

The light-receiving section 150 stands off, over the oxide layer 140, the source 120 and the drain 130. A tunneling arises en route from the light-receiving section 150 to the source 120 or the drain 130, where a thickness of 10 nm or less of the oxide layer 140 is preferred to facilitate the tunneling effect.

In the photo detector 100, a metallic, light-shielding layer may be overlaid on the area except for the top of the light-receiving section 150 as is not the case with a common MOSFET. The photo detector 100 exploits the light-shielding layer to restrict incident light only onto the light-receiving section and, in turn, to maximize photoelectric conversion efficiency.

The photo detector 100 may be fabricated via a standard CMOS process that is identical to the process employed to fabricate other circuits and used as part of an integrated system, which accounts for seamless integration and various applications.

Figure 2:
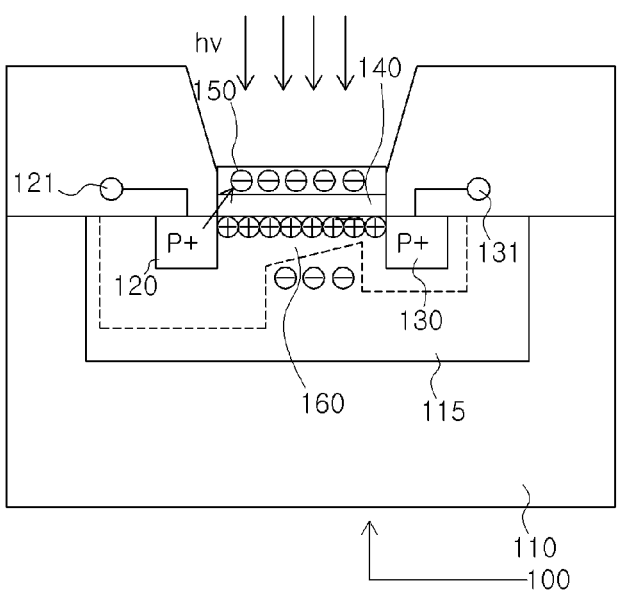
FIG. 2 is a cross-sectional view for describing a high-efficiency photoelectric conversion mechanism of the photo detector according to the present invention.

FIG. 2 is a cross-sectional view for describing a photoelectric conversion mechanism of a photo detector 100 according to the present invention. The photo detector 100 admits, via the top side of a light-receiving section, light that then generates electron-hole pairs (EHPs) deriving a certain electric field between the light-receiving section 150 and the source 120 or drain 130. Should the voltage reach a certain value between the source electrode 120 and the drain electrode 131, the charges excited by light tunnel, from the light-receiving section, through the oxide layer 140 into the source 120 or the drain 130. Upon the charges tunneling, holes are depleted in and electrons flow into the light-receiving section 150 so that the charge quantity of electrons overwhelms that of holes. The change in charge quantity lowers the threshold voltage of the channel 160 between the source 120 and the drain 130, which leads photocurrent to flow along the channel 160. The technology described so far is also expounded in detail both in the U.S. Pat. Nos. 8,569,806B2, 8,610,234B2 and 8,669,599B2 that were registered and U.S. Ser. No. 14/327,549 that are now pending, all of which were applied by the inventor of the present invention, therefore it may not be required to be described detailedly further.

Incident light comes only onto the top of the light-receiving section 150 of a photo detector 100 according to the present invention, where the light-receiving section opens outward to admit light of a diverse wavelengths that, in turn, is absorbed in the light-receiving section 150 or, depending on the wavelength, penetrates the light-receiving section 150 to reach the N-well 115 underneath or the substrate 110 further underneath. For example, should the light-receiving section 150 have a thickness of 150 nm or more, blue, or shortwave, light cannot reach the substrate 100 but is mostly absorbed in the light-receiving section 150. Unlike an existing, common photo detector, a photo detector 100 the present invention provides, even if any shortwave light is to be absorbed in the light-receiving section 150, failing in reaching the substrate underneath, changes in the charge quantity in the light-receiving section 150 by means of the energy the light-receiving section 150 absorbs and, in turn, drives current along the channel, which facilitates detection of light of short wavelengths while all the rest light of other wavelengths penetrates the light-receiving section 150 deriving a similar phenomenon in the light-receiving section 150, which also changes in the threshold voltage of the current channel.

Meanwhile, light with relatively longer wavelengths enough to penetrate the light-receiving section 150 generates EHPs also in the N-well 115 so that electrons pile up, as illustrated in FIG. 2, in the N-well 115 underneath the channel to have an influence on the change of the threshold voltage. A photo detector 100 fabricated according to such a method shows not only a very high sensitivity to detect even a single photon but also performance to drive a very large current flow by means of a slight amount of light. Accordingly, a photo detector 100 of the present invention may act as an image sensor and a solar cell as well.

A solar sensor chip as a system on chip (SOC) will be proposed below on the basis of such a photo detector to which a function of a solar cell has been newly added. While a PMOS-type configuration is described in FIGS. 1 and 2, an NMOS-type configuration and other similar configurations as well may also be established, all of which must be interpreted to be included in the rights of the present invention.

Figure 3:
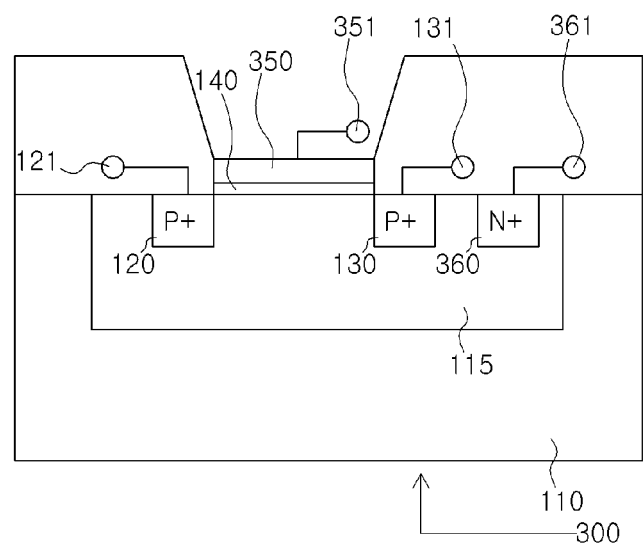
FIG. 3 is a cross-sectional view of a photo detector for a solar cell according to the present invention.
Figure 4:
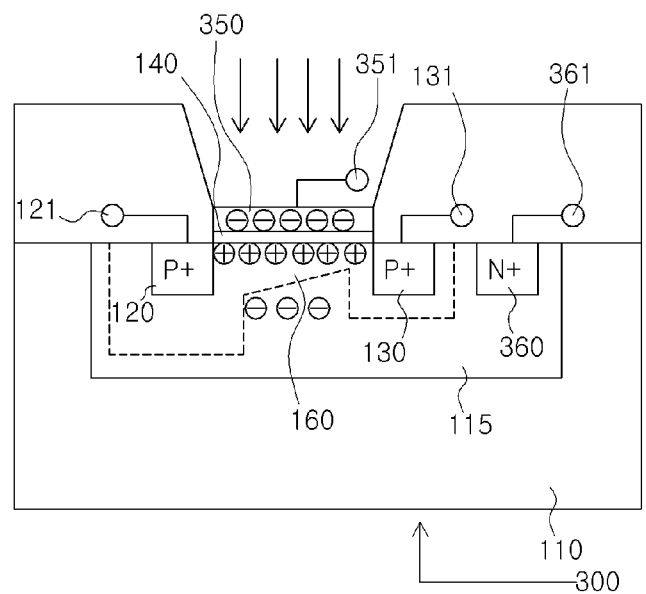
FIG. 4 is a cross-sectional view for describing an electric power generation mechanism of the photo detector according to the present invention.

FIG. 3 and FIG. 4 is a cross-sectional view of a photo detector for a solar cell according to the present invention and a cross-sectional view for describing an electric power generation mechanism of the photo detector 300, respectively. When operating as a solar cell, the photo detector 300 induces photocurrent according to light absorption and generates photovoltaic electromotive force.

In the photo detector 300, as illustrated in FIG. 3, upon light being absorbed in a light-receiving section 350, electrons tunnel through the oxide layer 140 from the channel between the source 120 and the drain 130 to move to the light-receiving section 350, which changes the entire charge quantity of the light-receiving section 350. The change in the current quantity induced by light may be estimated by measuring the voltage applied between the light-receiving section 350 and the drain 130. In addition, the charges accumulated in the N-well 115 may be estimated also by measuring the voltage between the drain 130 and the electrodes 131, 361 of the W-RST 360.

In the photo detector 300, as illustrated in FIG. 4, if light the energy of which is larger than the threshold voltage, determined in the fabrication process, of the transistor, photocurrent is to flow along the channel 160.

More specifically, the silicon interface was initially designed to have a threshold voltage, between the source 120 and the drain 130 where a channel 160 may be built up, right below the sub-threshold voltage, wherein, without incident light onto the light-receiving section 350, no photocurrent flows along the channel 160.

When light the energy of which is larger than the energy that binds an impurity doped in the light-receiving section 350 with a charge, a plurality of electrons and holes in the light-receiving section freely move on either side with the oxide layer 140, which prohibits in an equilibrium state each type of charges from getting across into the opposite side, as the barrier. Each EHP thus generated exists as an electron and a hole per se for a certain period of time before the electron and the hole are recombined, and migrates to the area to which the electric field is concentrated.

Because the potential of the silicon interface is right below the sub-threshold between the source and the drain 130, electrons or holes tunnel from the light-receiving section 350 to the source 120 or the drain 130 due to the charge quantity that has been increased and the electric field that has been dense driven by the incident light onto the light-receiving section 350, which lowers the threshold voltage of the channel 160 and, in turn, photocurrent flows proportionally to the amount of the light of the channel 160.

Figure 5:
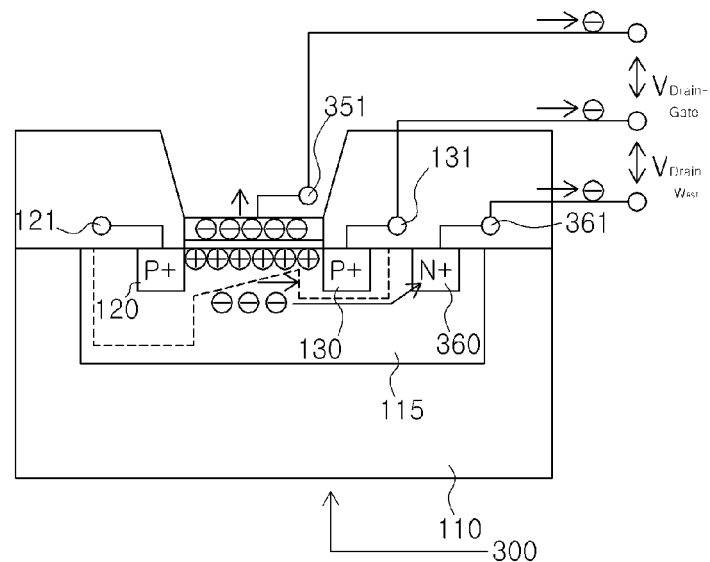
FIG. 5 is a cross-sectional view of a Voc acquisition mechanism of the photo detector according to the first embodiment of the present invention.

The voltage that drives the photocurrent may be detected via the light-receiving section 350 or the N-well 115. The value of the voltage thus measured may range from a few nanoamperes-to a few microamperes depending on the amount of light detected via the N-well 115, which brings about a voltage difference ranging from 0.1 to 1.0 V. The value is measured excluding any effect of dark current while such an output is acquired from a pixel of 3 μm or less. Therefore, a considerably larger output may be acquired by arranging a plurality of pixels in series or in parallel to constitute and control a pixel array. FIG. 5 is a cross-sectional view of a Voc acquisition mechanism of the photo detector 300 according to the first embodiment of the present invention.

As illustrated in FIG. 5, should a certain amount of voltage be applied between the source 120 and the drain 130, incident light into the light-receiving section 350 changes the threshold voltage, which drives photocurrent to flow. Light of longer wavelengths penetrates the light-receiving section 350 then is absorbed in the N-well 115, which generates a certain amount of charges also in the N-well 115 that then piles up around the interface of the channel according to a principle identical to that underlies the charge generation in the light-receiving section 150.

The photocurrent that flows along the channel is driven by the voltage that is generated by the charge quantity in the light-receiving section 350 and the N-well 115. More specifically, the photocurrent thus driven generates $V_{Drain-Gate}$ or the voltage between the drain 130 and the light-receiving section 350 and $V_{Drain-Wrst}$ or the Voltage Between the Drain 350 and the N-well 115. Therefore, Voc is acquired by measuring any one of the values of the $V_{Drain-Gate}$ applied between a terminal 131 wired to the drain 130 and a terminal 351 wired to the light-receiving section 350, and the $V_{Drain-Wrst}$ applied between a terminal 131 wired to the drain 350 and a terminal 361 wired to the N-well 115.

Figure 6:
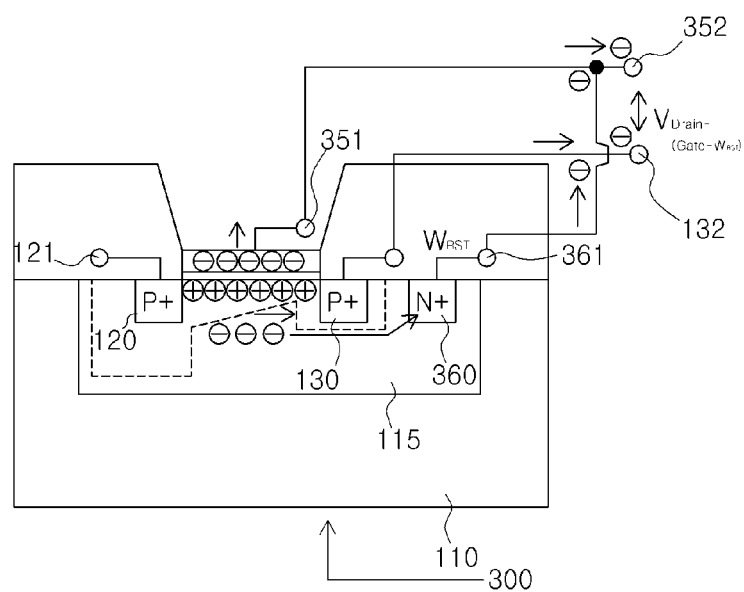
FIG. 6 is a cross-sectional view of a Voc acquisition mechanism of the photo detector according to the second embodiment of the present invention.

FIG. 6 is a cross-sectional view of a Voc acquisition mechanism of the photo detector 300 according to the second embodiment of the present invention.

Not only a larger amount of photocurrent from the photo detector 300 but also a larger amount of Voc is required to acquire also a larger output. In this regard, as illustrated in FIG. 6, a larger amount of voltage, $V_{Drain-(gate-wrst)}$, may be applied between a terminal that connects the light-receiving section 350 to the N-well 115 and a terminal 132 wired to the drain 130 if the threshold of the channel increases by connecting a terminal 351 wired to the light-receiving section 350 to a terminal 361 wired to an N+ diffusion layer 360, which is due to the charge quantity additionally increased when the electrons underneath of the N-well 115 moves to the N+ diffusion layer 360.

Figure 7:
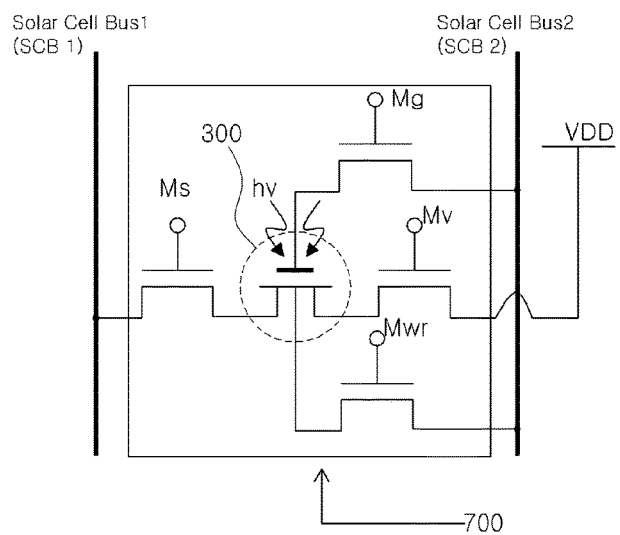
FIG. 7 illustrates a configuration of a unit pixel of a solar cell according to the present invention.

FIG. 7 illustrates a configuration of a unit pixel of a solar cell according to the present invention, where the solar cell, as a pixelated solar cell, comprises a unit pixel 700. The unit pixel 700 comprises the photo detector 300, a first switch, Ms; a second switch, Mg; a third switch Mwr; a fourth switch Mv; a first solar cell bus, SCB1; and a second solar cell bus, SCB 2. The photo detector 300 generates photocurrent along the channel between the source and the drain driven by the light, hv, incident onto the light-receiving section or the gate. The first switch, Ms, being wired between the source terminal of the photo detector 300 and the first solar cell bus, SCB 1, is made or broken for an on or off state. The second switch, Mg, being wired between the light-receiving section, or the gate, terminal of the photo detector 300 and the second solar cell bus, SCB 2, is made or broken for an on or off state. The third switch, Mwr, being wired between a reset terminal connected to the N-well or the substrate of the photo detector 300 and the second solar cell bus for an on or off state. The reset terminal is doped with impurities that are different from those doped in the source and the drain. With reference to FIGS. 3 through 6, the reset terminal, Wrst, is doped with n-type impurities other than those p-type impurities injected in the source and the drain while the reset terminal in an NMOS may be doped with p-type impurities other than those n-type impurities injected in the source and the drain, where VDD is linked to an extra, external system power source and left fixed in order to drive the photo detector 300. For this purpose, the VDD may be connected to the drain of the photo detector via the fourth switch, Mv, where a minimum value of VDD may be applied in order to make the dark current minimized while an extra circuit may be added outside the pixel to get rid of the dark current.

Meanwhile, the photo detector 300 may use a power source identical to what adjacent circuits use since the photo detector 300 is fabricated in a process identical to the process via which the adjacent circuits are fabricated. In such a case, unlike an existing photo detector, the photo detector 300 according to the present invention may be configured to use the power source per se the adjacent circuits use without any additional, extra power source.

With incident light onto the photo detector 300, photocurrent is to flow en route from the first solar cell bus, SCB 1, to the second solar cell bus, SCB 2, while Voc is to be obtained between the first solar cell bus, SCB 1, and the second solar cell bus, SCB 2, by controlling the second switch, Mg, and the third switch, Mwr.

The second switch, Mg, and the third switch, Mwr, may be selectively connected to an external matrix such as row decoders by on/off activities, where the second switch, Mg, and the third switch, Mwr, may be switched on to the second solar cell bus, SCB 2, either in a staggered mode or simultaneously. Should both the second switch, Mg, and the third switch, Mwr, be simultaneously made to be connected to an external matrix, a larger value of Voc may be obtained than in the case the light-receiving section and the N-well of the photo detector 300 is separately connected to the second solar cell bus, SCB 2, as illustrated in FIG. 6.

Figure 8:
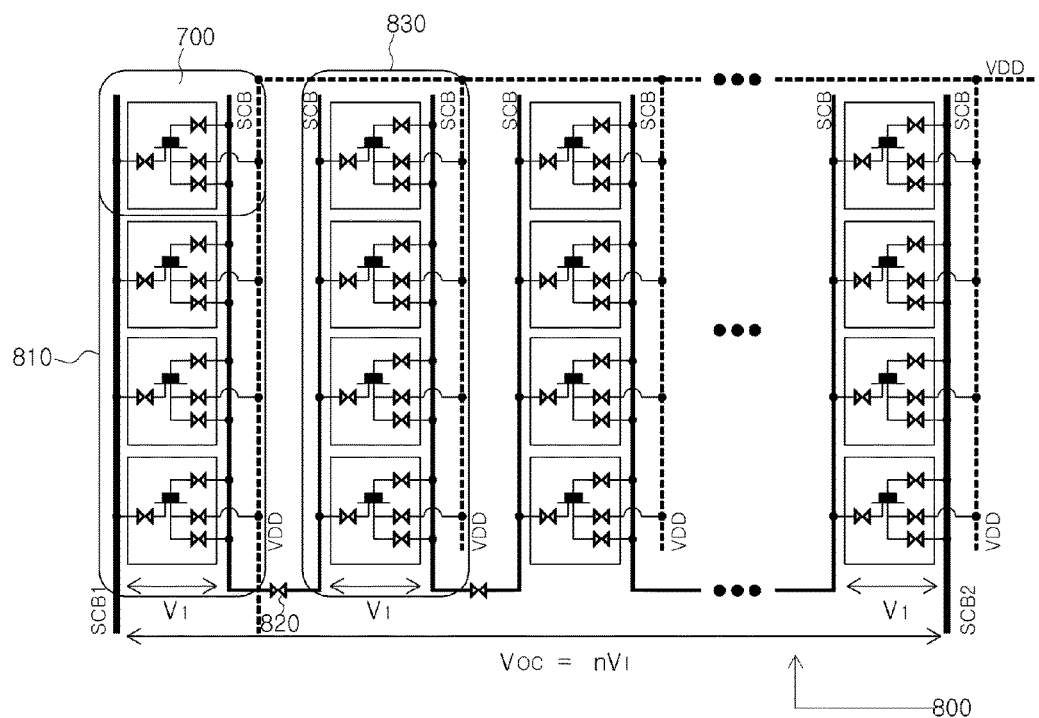
FIG. 8 illustrates a Voc acquisition mechanism in a pixel array according to the first embodiment of the present invention.

FIG. 8 illustrates a Voc acquisition mechanism in a pixel array according to the first embodiment of the present invention. The pixel array 800 comprises subelements 810 each of which arrays one or more unit pixel element 700 in a first direction; and a subelement switch 820 that is made or broken between the subelements 810 in order to array two or more subelements 810 in a second direction, wherein the subelement 810 comprises, as illustrated in FIG. 7, a photo detector 300 that flows, driven by light incident onto the gate electrode, photocurrent between the source and the drain; and a unit pixel element 700 that includes a first switch, Ms, and a second switch, Mg, that links the terminals of the photo detector 300 to the first solar cell bus, SCB 1 and the second solar cell bus, SCB 2. The unit pixel element 700 may additionally include a third switch, Mwr, that links the photo detector 300 to the second solar cell bus, SCB 2.

The subelement switch 820 is made or broken for an on or off state between the second solar cell bus, SCB 2, of the first subelement 810 and the first solar cell bus, SCB 1, of the second subelement 830.

The Voc obtained in the unit pixel 700 in the pixel array 800 is defined as open circuit voltage obtained between either the drain and the gate or the drain and the N-well and a larger value of Voc may be obtained if the pixels are arranged in such an array by adjusting the connection between the pixels. An identical value of Voc, V1, is applied between every two adjacent columns and n columns wired in series makes the entire output Voc nV1, a very significant value for Voc. As illustrated in FIG. 8, SCB lines may be wired in series each of which lies between every two columns to output in series the entire summation of the voltage of each column by controlling the subelement switch 820. Therefore, the output may be adjusted as desired considering that an appropriate value of the Voc required is determined by controlling the subelement switch 820.

Figure 9:
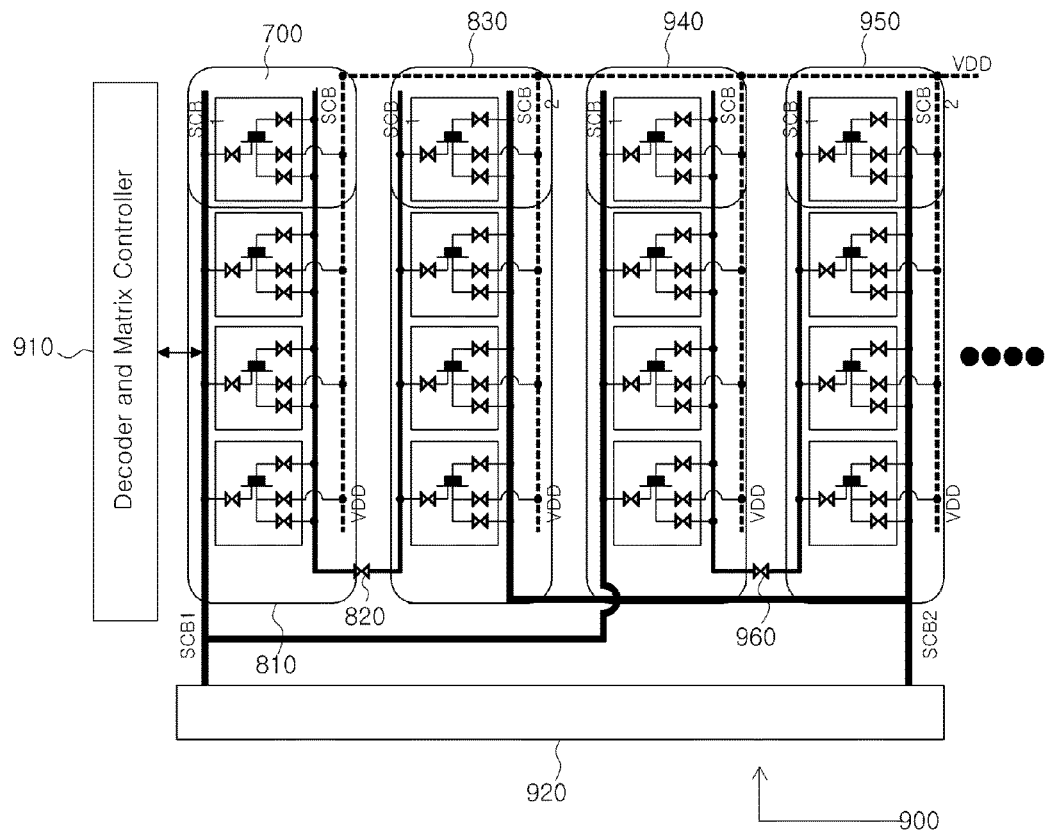
FIG. 9 is a Voc acquisition mechanism in a pixel array according to the second embodiment of the present invention.

FIG. 9 illustrates a Voc acquisition mechanism in a pixel array according to the second embodiment of the present invention. The pixel array 900 additionally includes, as illustrated in FIG. 8, a first control section 910 as well as the subelements 810 and the subelement switches 820. The first control section 910 generates individual control signals for the first switch and the second switch in the plurality of unit pixel elements then transmits the individual control signals to each of the unit pixels in the pixel array 900, where the first control section 910 may be denoted as decoder and matrix controller in that the first control section 910 decodes a control signal transmitted from the processor then transmits the control signal thus decoded to each of the unit pixels.

In case that a third subelement 940 and a fourth subelement 950 are added to the existing first subelement 810 and the second subelement 830, a second control section 920 may generates control signals and transmits the control signals to each of the subelements so that the first subelement 810 and the third subelement 940 share the first solar cell bus, SCB 1, and the second solar cell bus, SCB 2, with the second subelement 830 and the fourth subelement 950 by wiring the first subelement 810 and the second subelement 830 to the first subarray switch 820 and the internal buse, SCB, while by wiring the third subelement 940 and the fourth subelement 950 to the second subarray switch 960 and the internal bus, SCB. Therefore, a double amount of a Voc may be obtained by wiring the first subelement 810 and the second subelement 830 that correspond to two columns to the internal buses, SCBs, where the photocurrent and the Voc, being induced by light, are detected via the first solar cell bus, SCB 1, and the second solar cell bus, SCB 2.

In a similar way, a double amount of a Voc may be obtained by wiring the third subelement 940 and the fourth subelement 950 that correspond to two columns to the internal buses, SCBs, where the photocurrent and the Voc thus generated are detected via the first solar cell bus, SCB 1 and the second solar cell bus, SCB 2 and may be stored in a capacitor in the chip that constitutes the unit pixel element 700 or an external battery.

Furthermore, the first control section 910 may selectively designate a pixel element to contribute to photoelectric conversion and automatically interrupt voltage generation when the capacitor or battery is filled with an adequate amount of electric power. It is explicit that the first control section 910 and the second control section 920 may be established via a single, physical control section and also by a processor in an electronic device.

Figure 10:
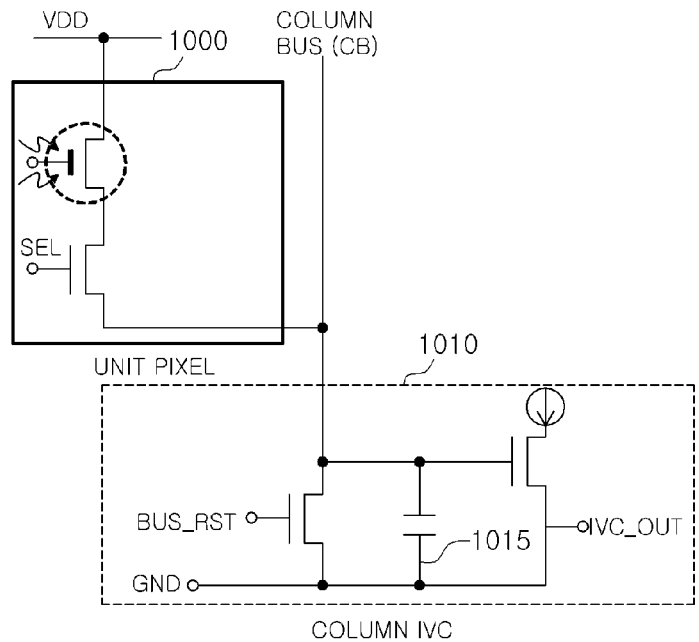
FIG. 10 is a schematic configuration of a unit pixel of an image sensor according to the first embodiment of the present invention.

FIG. 10 is a schematic configuration of a unit pixel of an image sensor according to the first embodiment of the present invention. The unit pixel 1000 is equipped a selection device, SEL, that is wired to the photo detector 300 while the unit pixel 1000 may be connected, via a column bus, CB, to an image sensor comprising an IVC circuit 1010 that is a DC voltage converting circuit, where the SEL may be established in a form, for example an MOSFET structure, among various devices. In such a case, both the photo detector 300 and the SEL are simultaneously fabricated in an MOSFET process, which facilitates fabrication convenience with lower costs.

Should the SEL be switched on, the photocurrent photoelectrically converted in the photo detector 300 of the unit pixel 1000 commences being accumulated in a capacitor 1015 in the IVC circuit 1010. The photocurrent stored in the capacitor 1015 is to be output as voltage the amount of which is IVC_OUT and the signal of which is transmitted to circuits including CDS (co-double sampling). When the selection device, SEL, is switched on, should the BUS_RST be switched on, the column bus, CB, and the photo detector 300 as well as the capacitor 1015 in the IVC circuit 1010 are directly connected to the ground section, GND, which discharges the charges accumulated and resets the signals. An integration time required for an image sensor may be defined via those activities aforementioned while a continuous image may be acquired via a rolling shutter technique.

Figure 11:
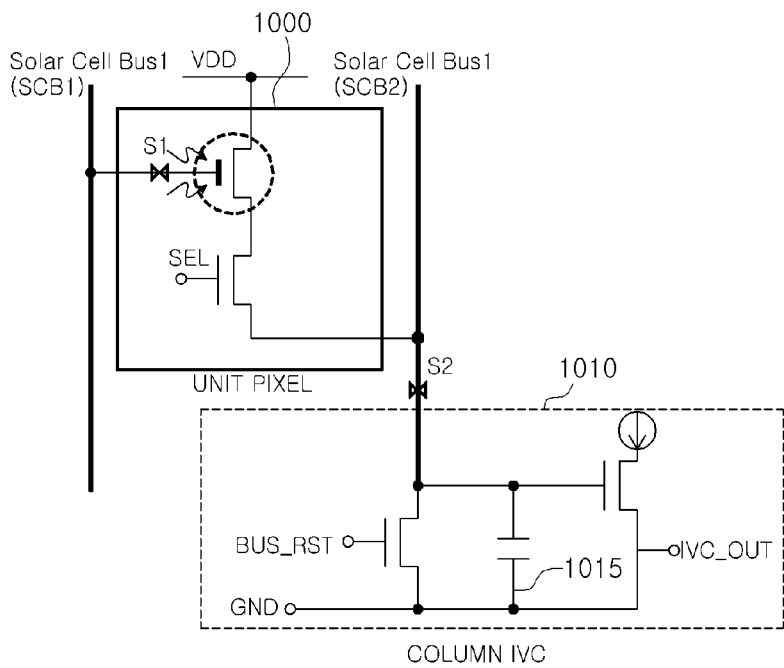
FIG. 11 is a schematic configuration of a unit pixel of a solar cell according to the first embodiment of the present invention.

FIG. 11 is a schematic configuration of a unit pixel of a solar cell according to the first embodiment of the present invention. The unit pixel 1100 is a solar sell into which the unit pixel 1000 of the 1T-type image sensor shown in FIG. 10 has been materialized. For this purpose, the unit pixel 1100 as a solar cell may be established utilizing the image sensor shown in FIG. 10 by adding a first solar cell bus, SCB 1, and a second solar cell bus 2, SCB 2, and switches S1 and S2.

More specifically, the unit pixel 1100 comprises the photo detector 300 that generates photoccurent, driven by incident light onto the gate, along the channel between the source and the drain; a first switch, S1, that links the gate terminal of the photo detector 300 and the first solar cell bus, SCB 1, to be made or broken; and a selection device, SEL, that links the source terminal of the photo detector 300 and the second solar cell bus, SCB 2, to output the photocurrent off the pixel output terminal 1010, where the pixel output terminal 1010 corresponds to the IVC circuit 1010 shown in FIGS. 10 and 11 while the unit pixel 1100 may additionally include a second switch, S2, that links the selection device and the pixel output terminal 1010 to be made or broken. Electric power is generated from photocurrent and Voc obtained between the first solar cell bus, SCB 1, and the second solar cell bus, SCB 2, by connecting, via the first switch, S1, the first solar cell bus, SCB 1 and the gate of the photo detector 300 and utilizing, via the second switch, S2, the column bus, CB, shown in FIG. 10 as the second solar cell bus, SCB 2. In other words, either image sensor or solar cell may be selectively operated as aforementioned by making or breaking the first switch, S1, and the second switch, S2, where the unit pixel 1000 operates as a solar cell when the first switch, S1, is on while the selection device, SEL, or the second switch, S2, is off whereas the unit pixel 1000 operates as an image sensor when the first switch, S1, is off while the second switch, S2, is on.

In addition, the pixel output terminal 1010 includes a capacitor 1015 that links the second solar cell bus, SCB 2 and the ground section, GND, and stores the photocurrent and a reset device, BUS_RST, that is wired in parallel to the capacitor 1015 and links the second solar cell bus, SCB 2 and the ground section, GND.

Figure 12:
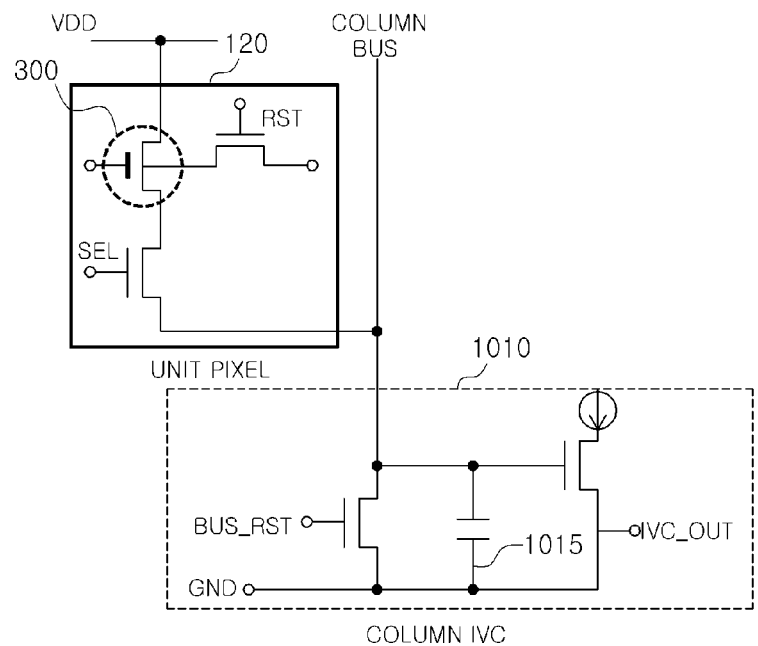
FIG. 12 is a schematic configuration of a second unit pixel of an image sensor according to the second embodiment of the present invention.

FIG. 12 is a schematic configuration of a second unit pixel of an image sensor according to the second embodiment of the present invention. The second unit pixel 1200 additionally includes a reset device, RST, that is wired to the well of the photo detector 300 in addition to the existing the photo detector 300 and the selection device, SEL, shown in FIG. 10. The unit pixel 1200 may operate as an image sensor by wiring each of columns of the unit pixel to the IVC circuit 1010. When the selection device is switched on, the photocurrent photoelectrically converted in the photo detector 300 is stored in the capacitor 1015 of the IVC circuit 1010. The photocharges thus stored in the capacitor 1015 is to be output as voltage the amount of which is IVC-OUT and the signal of which is transmitted to circuits including CDS.

When the selection device, SEL, is switched on, should the BUS_RST be switched on, the column bus, SC, and the photo detector 300 as well as the capacitor 1015 in the IVC circuit 1010 are directly connected to the ground section, GND, which discharges the charges accumulated and resets the signals.

The reset device, RST, may be used when the signals are not reset seamlessly via the photo detector 300 or in order to manually adjust the threshold voltage of the current channel. The reset device, RST, may also be used to specially acquire images with a high frame rate without delay, etc.

Figure 13:
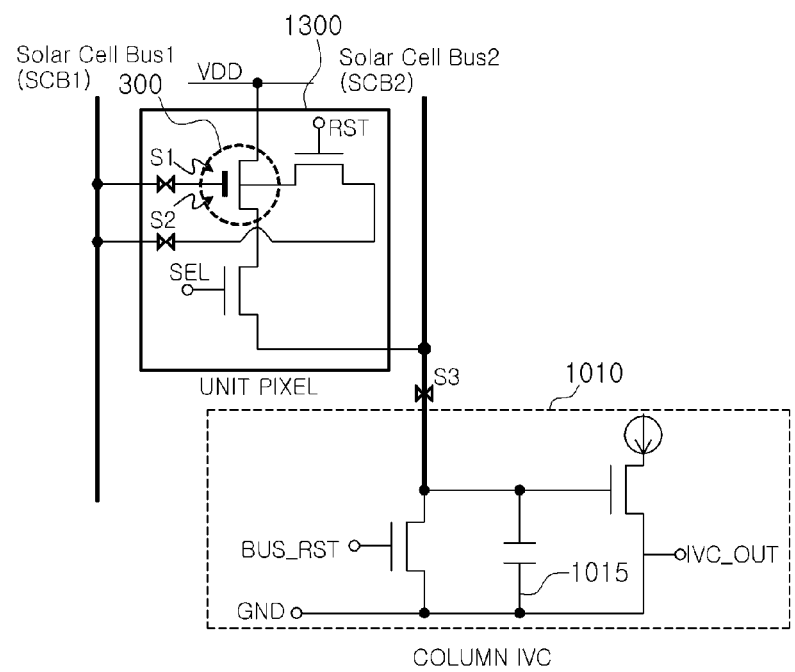
FIG. 13 is a schematic configuration of a second unit pixel of a solar cell according to the second embodiment of the present invention.

FIG. 13 illustrates a schematic configuration of a second unit pixel of a solar cell according to the second embodiment of the present invention. The second unit pixel 1300 is a solar cell into which the unit pixel 1200 of the 2T-type image sensor shown in FIG. 12 has been materialized. The second unit pixel 1300 comprises a photo detector 300 that drives photocurrent, induced by incident light onto the gate, to flow along the channel between the source and that drain; a first switch, S1, that links the gate terminal of the photo detector 300 and a first solar cell bus, SCB 1 and is switched on or switched off; a second switch, S2, that links the reset terminal of the photo detector 300 and the first solar cell bus, SCB 1 and is switched on or switched off; a selection device, SEL, that links the source terminal of the photo detector 300 and the second solar cell bus, SCB 2 to putout the photoccurent off the pixel output terminal 1010; and, additionally, a reset device, RST, that is wired to the well of the photo detector 300, where the reset terminal, RST, is doped with impurities that are different from those doped in the source and the drain.

Moreover, the second unit pixel 1300 may additionally include a third switch, S3, that is switched on or switched off being wired between the selection device, SEL, and the pixel output terminal 1010. The unit pixel operates as a solar cell when the first switch, S1, or the second switch, S2, is on while the third switch is off whereas the unit pixel operates as an image sensor when the first switch, S1 and the second switch, S2, are off while the third switch, S3, is on. The first switch, S1, and the second switch, S2, may be simultaneously turned on in order to obtain a larger amount of Voc.

Figure 14:
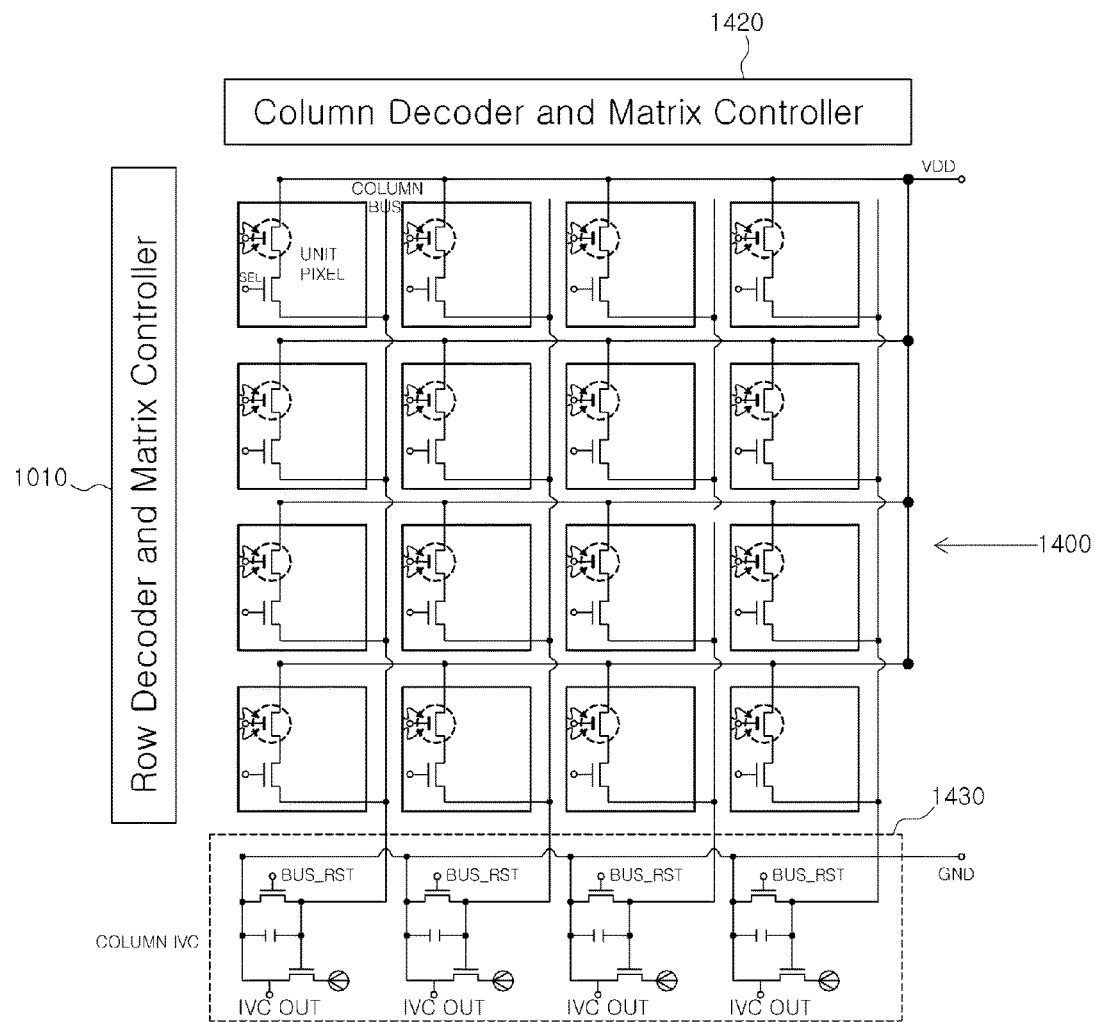
FIG. 14 is an image sensor array according to the present invention.

The pixel output terminal 1010 includes a capacitor 1015 that, being wired between the second solar cell bus, SCB 2, and the ground section, GND, stores the photocurrent; and a reset device, BUS_RST, that is wired between the second solar cell bus, SCB 2, and the ground section, GND, and wired in parallel to the capacitor 1015, on the basis of the configuration of which electric power is generated from photocurrent and Voc obtained between the first solar cell bus line, SCB 1, and the second solar cell bus line, SCB 2. FIG. 14 is an image sensor array according to the present invention. The image sensor array 1400 acts as a high-sensitivity image sensor when a row decoder and matrix controller 1410 and a column decoder and matrix controller 1420 transfers the photocurrent photoelectrically converted in the unit pixels 1000, 1200 of each column to an IVC circuit array 1430 in which the IVC circuits of the columns are arranged in a direction parallel to the column then the IVC circuit array 1430 converts the photocurrent to voltage signal and transfers the voltage signal to CDS, etc, on the basis of the configuration of which a high-sensitivity, high-rate image sensor may be established. In addition, the unit pixel may be materialized by a PPS technique, but in such a case, integration may not commence before the row decoder selects a pixel because the effect of a parasitic capacitor is infinitesimal or does not exist when compared to the output current of the light-receiving device in the pixel, which accounts for a major difference of this technology distinct from a CIS unit pixel of an existing APS technique. Therefore, a high-frame rate image sensor may be configured by multiprocessing the signals in a modified rolling shutter technique. The light signal may be transferred also via a column parallel technique as well as a rolling shutter technique.

Because the unit pixel is very simple and small in terms of the configuration and dimension, respectively, an image the frame rate of which ranges from 500 to 10,000 fps may be acquired, as in a general global shutter, by placing a capacitor in the unit pixel to store the data at one time in analogue memory and read the data at a high speed.

A unit pixel of an image sensor and an image sensor as a matrix comprising the unit pixels have been exemplified so far via a plurality of embodiments according to the present invention. The unit pixels according to the embodiments of the present invention are arrayed 2-dimensionally while the unit pixels may be arranged in the array, in order to build up a frame, in an existing VGA, HD or full HD form including 640 by 480, 1280 by 720, 1920 by 1080, etc., 4K UHD including 3840 by 2160, 4096 by 2160, etc. or 8K UHD including 7680 by 4320.

A larger photocurrent in a unit pixel provided by the present invention than that in an existing photo diode may be induced based on such a configuration aforementioned in that, different from an existing photo diode technology that distinguishes brightness from darkness by means only of the charge quantity stored in the electrostatic capacity, a unit pixel provided by the present invention controls the current flow along the source-drain channel due to the change in the charge quantity as a field effect induced by incident light onto the light-receiving section and, at the same time, receives charges via the drain, which per se amplifies the signal.

Figure 15:
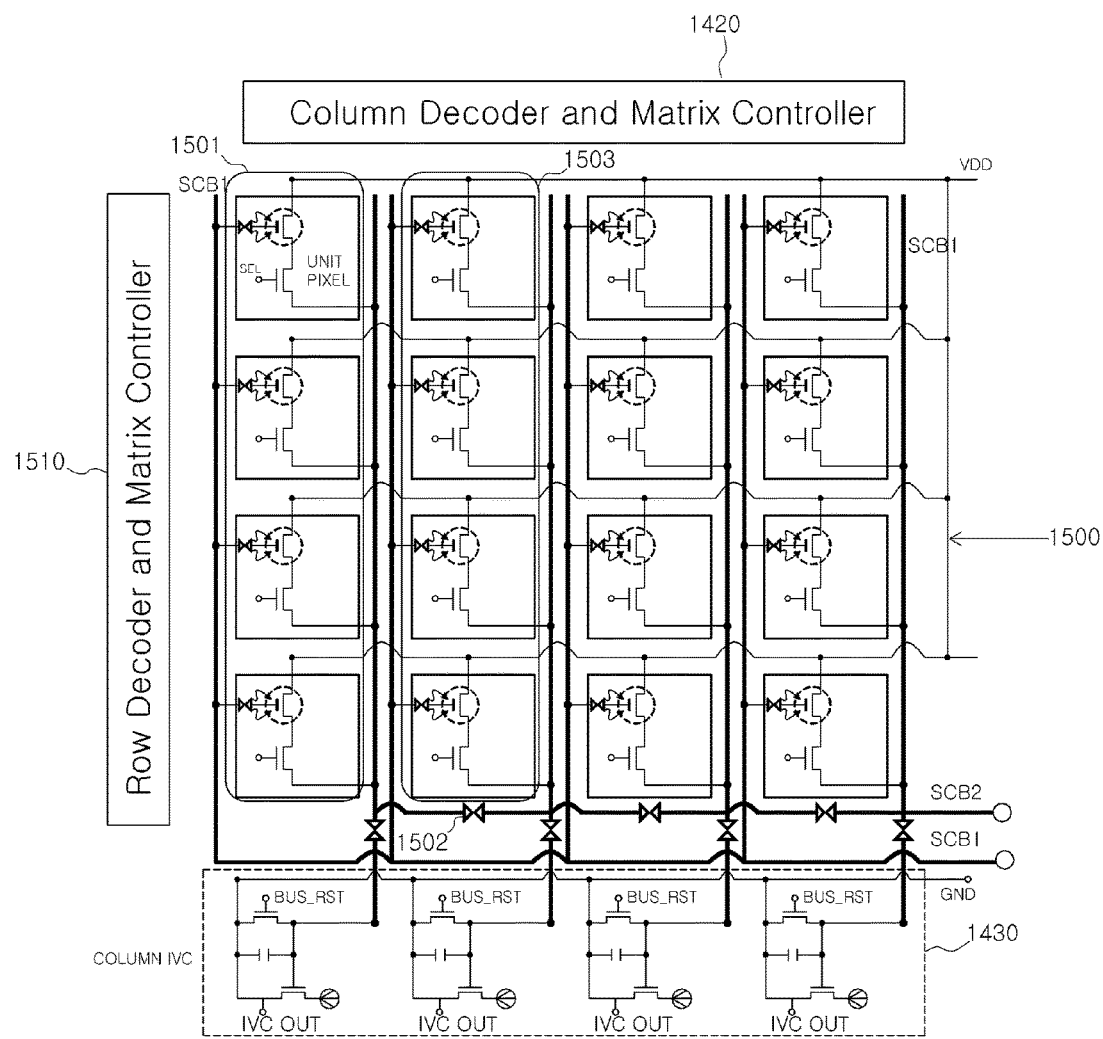
FIG. 15 is an array element that acts as an image sensor or a solar cell according to the present invention.

FIG. 15 is an array element that acts as an image sensor or a solar cell according to the present invention. The array element 1500 comprises a subelement 1501 in which two or more unit pixel elements are arranged in a first direction and a subelement switch 1502 that is wired and switched on or switched off between the subelements in order to arrange the subelements in a second direction, where the subelement 1501, as illustrated in FIGS. 11 and 13, comprises a photo detector 300 that generates photocurrent flow along the channel between the source and the drain; a plurality of switches, S1 through S3 and SEL, that connect the terminals of the photo detector to the first solar cell bus and the second solar cell bus; and unit pixel elements 1100, 1300 that include a pixel output terminal 1010 that is wired to the second solar cell bus and stores the photocurrent by means of voltage.

The subelement switch 1502 may be wired and switched on or switched off between the second solar cell bus, SCB 2, of the first subelement 1501 and the second solar cell bus, SCB 2, of the second subelement 1503; or as illustrated in FIGS. 8 and 9, between the second solar cell bus, SCB 2, of the first subelement 1501 and the second solar cell bus, SCB 2, of the second subelement 1503.

The array element 1500 may additionally include a first control section 1510 that generates individual signals for a plurality of switches, S1 through S3 and SEL, in the two or more unit pixel elements 1100 where, as illustrated in FIG. 13, the first switch, S1, is wired and switched on or switched off between the gate terminal of the photo detector 300 and the first solar cell bus, SCB 1; and the selection device, SEL, is wired between the source terminal of the photo detector 300 and the second solar cell bus, SCB 2, then outputs the photocurrent thus induced to the pixel output terminal 1530. Meanwhile, the photo detector 300 may additionally include a second switch, S2, that is wired and switched on or switched off between the reset terminal of the photo detector 300 and the first solar cell bus, SCB 1; and/or a third switch, S3, that is wired and switched on or switched off between the selection device, SEL, and the pixel output terminal 1010, where the reset terminal is doped with impurities that are different from those doped in the source and the drain.

In addition, the first subelement 1501 and the second subelement 1502 may share the first solar cell bus, SCB 1, and the second solar cell bus, SCB 2, in order to generate photovoltaic electromotive force as desired. Therefore, the first solar cell bus, SCB 1, the second solar cell bus, SCB 2 and a plurality of switches as shown FIG. 11 or FIG. 13 may be embedded in the array element 1500 so that the image sensor of the image sensor array 1400 is to be converted to a solar cell. That is, because an image sensor shares a single photo detector with a solar cell, electric power production and image acquisition occurs as necessary one after the other. This is practical since a photo detector applied to a pixelated CMOS solar cell according to the present invention may be fabricated as per a standard CMOS process, which facilitates integration of the photo detector in a single chip with adjacent circuits.

Figure 16:
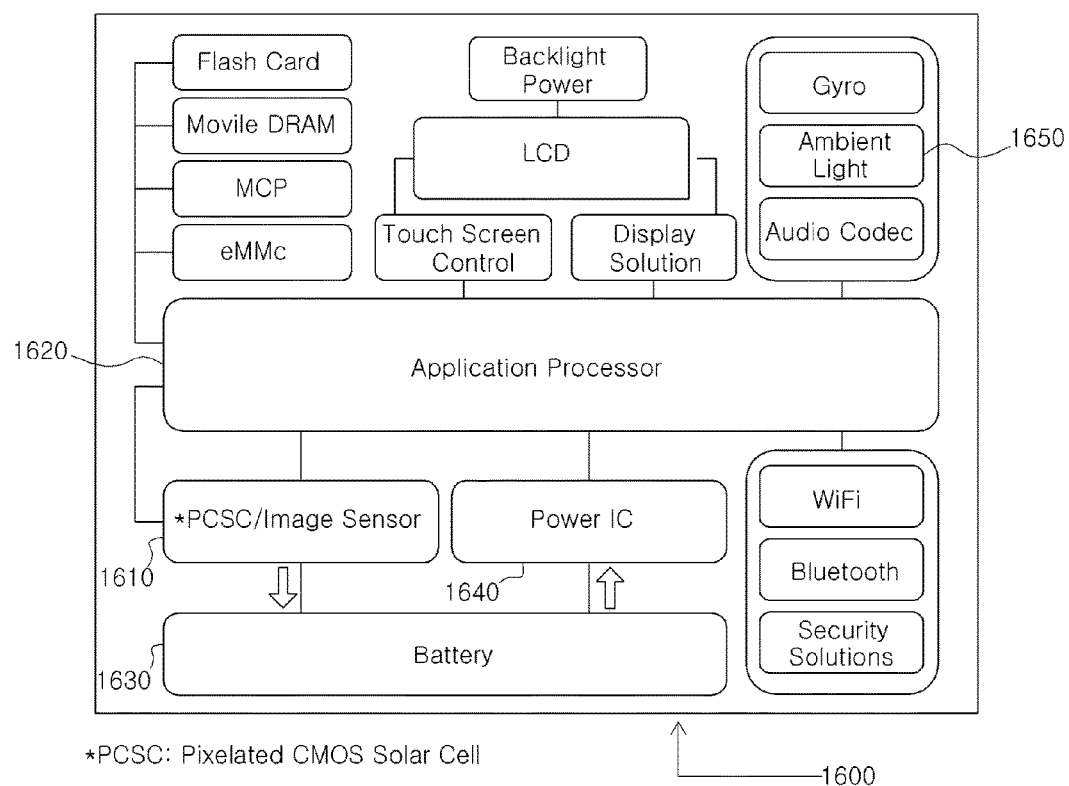
FIG. 16 is a block diagram of an electronic device that acts as an image sensor or a solar cell according to the present invention.

FIG. 16 is a block diagram of an electronic device that acts as an image sensor or a solar cell according to the present invention. The electronic device 1600 means image acquiring equipment including such as digital cameras, CCTVs, etc. and other diverse kinds of equipment such as smartphones, tablet PCs, TVs, etc. that feature a function of image acquisition. The electronic device 1600 comprises an image sensor section 1610 that comprises a plurality of unit pixels that can act as a solar cell depending on control signals; a processor 1620 that generates the control signal and transmits the control signal to the image sensor section 1610; a battery 1630 that is supplied with electric power from the image sensor section 1610 in which the electric power has been charged; and an electric power IC 1640 that is supplied with electric power from the image sensor section 1610 in which the electric power has been charged or from the battery 1630, where each of the unit pixels includes a photo detector that generates photocurrent current, being induced by light incident onto the gate, along the channel between the source and the drain.

Meanwhile, should there be no event in which the image sensor section 1610 acts as an image sensor, the processor 1620 transmits the control signals to the image sensor section 1610 so that the image sensor section 1610 may acts as a solar cell.

In addition, the electronic device 1600 may additionally include an ambient light sensor 1650 that collects ambient light then, should the intensity of the light exceed a certain value, affords the process 1620 the ambient light information so that the process 1620 generates the control signals.

Furthermore, each of the unit pixels, as illustrated in FIG. 7, may additionally include a first switch, S1, that is wired and switched on or switched off between the source terminal of the photo detector 300 and the first solar cell bus, SCB 1; and a second switch, S2, that is wired and switched on or switched off between the gate terminal of the photo detector 300 and the second solar cell bus, SCB 2.

Again in addition, each of the unit pixels, with reference to FIG. 11, may additionally include a first switch, S1, that is wired and switched on or switched off between the gate terminal of the photo detector 300 and the first solar cell bus, SCB 1; and a selection device, SEL, that is wired and switched on or switched off between the source terminal of the photo detector 300 and the second solar cell bus, SCB 2, and outputs the photocurrent off the pixel output terminal 1010.

For this purpose, the image sensor section 1610 may act as a pixelated CMOS solar cell (PCSC) and be fabricated, via a standard CMOS process, in a single chip in which an image sensor is also embedded, which practices microminiaturization and low-power consumption simultaneously. Moreover, the electric power the image sensor section 1610 produces may be stored in the battery 1630 such as a secondary cell so that the electric power IC 1640 may be supplied as necessary with electric power without a separate, external power source.

The description thus far is nothing more than an exemplification of the present invention and a person skilled in the art to which this invention belongs may, deviating from neither technical thoughts nor essential features of the present invention, amend and modify those exemplifications.

In this perspective, the embodiments demonstrated in the specification must be interpreted to exemplify, not to restrict, the technical thoughts of the present invention. Each element as a single, integrated component according to an embodiment of the present invention, for example, may be divided into a plurality of elements to be practiced whereas an element as a plurality of non-integrated components may be combined into a single, integrated component to be practiced.

The scope of the present invention should be interpreted on the basis of the claims undermentioned of the specification. The meaning and scope of the claims of the specification, and all the modification and transformation derived from the thoughts equivalent to the thoughts of the claims must be included to the scope of the present invention. FIG. 14 is an image sensor array according to the present invention. The image sensor array 1400 acts as a high-sensitivity image sensor when a row decoder and matrix controller 1410 and a column decoder and matrix controller 1420 transfers the photocurrent photoelectrically converted in the unit pixels 1000, 1200 of each column to an IVC circuit array 1430 in which the IVC circuits of the columns are arranged in a direction parallel to the column then the IVC circuit array 1430 converts the photocurrent to voltage signal and transfers the voltage signal to CDS, etc, on the basis of the configuration of which a high-sensitivity, high-rate image sensor may be established. In addition, the unit pixel may be materialized by a PPS technique, but in such a case, integration may not commence before the row decoder selects a pixel because the effect of a parasitic capacitor is infinitesimal or does not exist when compared to the output current of the light-receiving device in the pixel, which accounts for a major difference of this technology distinct from a CIS unit pixel of an existing APS technique. Therefore, a high-frame rate image sensor may be configured by multiprocessing the signals in a modified rolling shutter technique. The light signal may be transferred also via a column parallel technique as well as a rolling shutter technique.

Because the unit pixel is very simple and small in terms of the configuration and dimension, respectively, an image the frame rate of which ranges from 500 to 10,000 fps may be acquired, as in a general global shutter, by placing a capacitor in the unit pixel to store the data at one time in analogue memory and read the data at a high speed.

A unit pixel of an image sensor and an image sensor as a matrix comprising the unit pixels have been exemplified so far via a plurality of embodiments according to the present invention. The unit pixels according to the embodiments of the present invention are arrayed 2-dimensionally while the unit pixels may be arranged in the array, in order to build up a frame, in an existing VGA, HD or full HD form including 640 by 480, 1280 by 720, 1920 by 1080, etc., 4K UHD including 3840 by 2160, 4096 by 2160, etc. or 8K UHD including 7680 by 4320.

A larger photocurrent in a unit pixel provided by the present invention than that in an existing photo diode may be induced based on such a configuration aforementioned in that, different from an existing photo diode technology that distinguishes brightness from darkness by means only of the charge quantity stored in the electrostatic capacity, a unit pixel provided by the present invention controls the current flow along the source-drain channel due to the change in the charge quantity as a field effect induced by incident light onto the light-receiving section and, at the same time, receives charges via the drain, which per se amplifies the signal.

FIG. 15 is an array element that acts as an image sensor or a solar cell according to the present invention. The array element 1500 comprises a subelement 1501 in which two or more unit pixel elements are arranged in a first direction and a subelement switch 1502 that is wired and switched on or switched off between the subelements, where the subelement 1501, as illustrated in FIGS. 11 and 13, comprises a photo detector 300 that generates photocurrent flow along the channel between the source and the drain; a plurality of switches, S1 through S3 and SEL, that connect the terminals of the photo detector to the first solar cell bus and the second solar cell bus; and unit pixel elements 1100, 1300 that include a pixel output terminal 1010 that is wired to the second solar cell bus and stores the photocurrent by means of voltage.

The subelement switch 1502 may be wired and switched on or switched off between the second solar cell bus, SCB 2, of the first subelement 1501 and the second solar cell bus, SCB 2, of the second subelement 1503; or as illustrated in FIGS. 8 and 9, between the second solar cell bus, SCB 2, of the first subelement 1501 and the second solar cell bus, SCB 2, of the second solar cell bus.

The array element 1500 may additionally include a first control section 1510 that generates individual signals for a plurality of switches, S1 through S3 and SEL, in the two or more unit pixel elements 1100 where, as illustrated in FIG. 13, the first switch, S1, is wired and switched on or switched off between the gate terminal of the photo detector 300 and the first solar cell bus, SCB 1; and the selection device, SEL, is wired between the source terminal of the photo detector 300 and the second solar cell bus, SCB 2, then outputs the photocurrent thus induced to the pixel output terminal 1530. Meanwhile, the photo detector 300 may additionally include a second switch, S2, that is wired and switched on or switched off between the reset terminal of the photo detector 300 and the first solar cell bus, SCB 1; and/or a third switch, S3, that is wired and switched on or switched off between the selection device, SEL, and the pixel output terminal 1010, where the reset terminal is doped with impurities that are different from those doped in the source and the drain.

In addition, the first subelement 1501 and the second subelement 1502 may share the first solar cell bus, SCB 1, and the second solar cell bus, SCB 2, in order to generate photovoltaic electromotive force as desired. Therefore, the first solar cell bus, SCB 1, the second solar cell bus, SCB 2 and a plurality of switches as shown FIG. 11 or FIG. 13 may be embedded in the array element 1500 so that the image sensor of the image sensor array 1400 is to be converted to a solar cell. That is, because an image sensor shares a single photo detector with a solar cell, electric power production and image acquisition occurs as necessary one after the other. This is practical since a photo detector applied to a pixelated CMOS solar cell according to the present invention may be fabricated as per a standard CMOS process, which facilitates integration of the photo detector in a single chip with adjacent circuits.

FIG. 16 is a block diagram of an electronic device that acts as an image sensor or a solar cell according to the present invention. The electronic device 1600 means image acquiring equipment including such as digital cameras, CCTVs, etc. and other diverse kinds of equipment such as smartphones, tablet PCs, TVs, etc. that feature a function of image acquisition. The electronic device 1600 comprises an image sensor section 1610 that comprises a plurality of unit pixels that can act as a solar cell depending on control signals; a processor 1620 that generates the control signal and transmits the control signal to the image sensor section 1610; a battery 1630 that is supplied with electric power from the image sensor section 1610 in which the electric power has been charged; and an electric power IC 1640 is supplied with electric power from the image sensor section 1610 in which the electric power has been charged or from the battery 1630, where each of the unit pixels includes a photo detector that generates photocurrent current, being induced by light incident onto the gate, along the channel between the source and the drain.

Meanwhile, should there be no event in which the image sensor section 1610 acts as an image sensor, the processor 1620 transmits the control signals to the image sensor section 1610 so that the image sensor section 1610 may acts as a solar cell.

In addition, the electronic device 1600 may additionally include an ambient light sensor 1650 that collects ambient light then, should the intensity of the light exceed a certain value, affords the process 1620 the ambient light information so that the process 1620 generates the control signals.

Furthermore, each of the unit pixels, as illustrated in FIG. 7, may additionally include a first switch, S1, that is wired and switched on or switched off between the source terminal of the photo detector 300 and the first solar cell bus, SCB 1; and a second switch, S2, that is wired and switched on or switched off between the gate terminal of the photo detector 300 and the second solar cell bus, SCB 2.

Again in addition, each of the unit pixels, with reference to FIG. 11, may additionally include a first switch, S1, that is wired and switched on or switched off between the gate terminal of the photo detector 300 and the first solar cell bus, SCB 1; and a selection device, SEL, that, being wired and switched on or switched off between the source terminal of the photo detector 300 and the second solar cell bus, SCB 2, outputs the photocurrent off the pixel output terminal 1010.

For this purpose, the image sensor section 1610 may act as a pixelated CMOS solar cell (PCSC) and be fabricated, via a standard CMOS process, in a single chip in which an image sensor is also embedded, which practices microminiaturization and low-power consumption simultaneously. Moreover, the electric power the image sensor section 1610 produces may be stored in the battery 1630 such as a secondary cell so that the electric power IC 1640 may be supplied as necessary with electric power without a separate, external power source.

The description thus far is nothing more than an exemplification of the present invention and a person skilled in the art to which this invention belongs may, deviating from neither technical thoughts nor essential features of the present invention, amend and modify those exemplifications.

In this perspective, the embodiments demonstrated in the specification must be interpreted to exemplify, not to restrict, the technical thoughts of the present invention. Each element as a single, integrated component according to an embodiment of the present invention, for example, may be divided into a plurality of elements to be practiced whereas an element as a plurality of non-integrated components may be combined into a single, integrated component to be practiced.

The scope of the present invention should be interpreted on the basis of the claims undermentioned of the specification. The meaning and scope of the claims of the specification, and all the modification and transformation derived from the thoughts equivalent to the thoughts of the claims must be included to the scope of the present invention.

The invention claimed is:

1. An electronic device, which acts as an image sensor or a solar cell, comprising:
   an image sensor section that comprises two or more unit pixels that may act as a solar cell depending on a control signal; and
   a processor that generates the control signal and transmits the control signal to the image sensor section,
   wherein each of the unit pixels includes a photo detector that drives a photocurrent flow, induced by light incident onto a gate, along a channel between a source and a drain.

2. The electronic device of claim 1, wherein, when there is no event in which the image sensor section acts as an image sensor, the processor transmits the control signal to the image sensor section.

3. The electronic device of claim 1 additionally including a battery that is supplied with electric power from the image sensor section that has charged the electric power.

4. The electronic device of claim 3 additionally including an electric IC that is supplied with electric power from the image sensor section that has charged the electric power or from the battery.

5. The electronic device of claim 1 additionally including an ambient light sensor that collects ambient light then, when the intensity of the light exceeds a certain value, affords the process the ambient light information so that the process generates the control signals.

6. The electronic device of claim 1, wherein each of the unit pixels additionally includes:
   a first switch that is wired and switched on or switched off between the source terminal of the photo detector and the first solar cell bus; and
   a second switch that is wired and switched on or switched off between the gate terminal of the photo detector and the second solar cell bus.

7. The electronic device of claim 1, wherein of the unit pixels additionally includes:
   a first switch that is wired and switched on or switched off between the gate terminal of the photo detector and the first solar cell bus; and
   a selection device that is wired and switched on or switched off between the source terminal of the photo detector and the second solar cell bus, and outputs the photocurrent off the pixel output terminal.

* * * * *